(12) United States Patent
Shao et al.

(10) Patent No.: US 7,598,125 B2
(45) Date of Patent: Oct. 6, 2009

(54) METHOD FOR WAFER LEVEL PACKAGING AND FABRICATING CAP STRUCTURES

(75) Inventors: Shih-Feng Shao, Taipei Hsien (TW); Ming-Yen Chiu, Ping-Tung Hsien (TW)

(73) Assignee: Touch Micro-System Technology Inc., Taoyuan County (TW)

( * ) Notice: Subject to any disclaimer, the term of this patent is extended or adjusted under 35 U.S.C. 154(b) by 102 days.

(21) Appl. No.: 11/426,573

(22) Filed: Jun. 26, 2006

(65) Prior Publication Data

US 2007/0161158 A1 Jul. 12, 2007

(30) Foreign Application Priority Data

Jan. 12, 2006 (TW) .............................. 95101278 A (51) Int. Cl.
*H01L 21/00* (2006.01)
(52) U.S. Cl. .................. 438/125; 438/106; 438/116; 438/121; 257/704; 257/E23.183; 257/E23.181; 257/E23.192; 257/E23.193; 257/684; 257/433; 257/434; 257/678; 257/685; 257/731
(58) Field of Classification Search .......... 257/704, 257/E23.18, E23.181, E23.192, E23.193, 257/684, 433, 434, 678, 685, 731; 438/125, 438/106, 116, 121
See application file for complete search history.

(56) References Cited

U.S. PATENT DOCUMENTS

| | | | |
|---|---|---|---|
| 6,750,521 B1 * | 6/2004 | Chilcott et al. | 257/414 |
| 7,037,759 B2 | 5/2006 | Tao | |
| 2001/0020738 A1 | 9/2001 | Iizima et al. | |
| 2004/0219700 A1 | 11/2004 | Silverbrook | |
| 2005/0023629 A1 * | 2/2005 | Ding et al. | 257/414 |
| 2005/0098790 A1 * | 5/2005 | Gallup et al. | 257/100 |
| 2006/0001147 A1 * | 1/2006 | Tomita et al. | 257/690 |
| 2007/0031994 A1 * | 2/2007 | Wang | 438/113 |

FOREIGN PATENT DOCUMENTS

| | | |
|---|---|---|
| EP | 1346949 | 9/2003 |
| TW | I225696 | 12/2004 |
| TW | I233191 | 5/2005 |
| TW | I236717 | 7/2005 |
| TW | I239082 | 9/2005 |
| TW | I245431 | 12/2005 |

OTHER PUBLICATIONS

Wolf, Stanley, Tauber, Richard N., Silicon Processing for the VLSI Era, vol. 1: Process Technology, Lattice Press, Copyright 1986, p. 409.*

* cited by examiner

*Primary Examiner*—Jae Lee
(74) *Attorney, Agent, or Firm*—Winston Hsu (57) ABSTRACT

A cap wafer with cavities is etched through areas not covered by a patterned photoresist to form a plurality of openings. The cap wafer is bonded to a transparent wafer at the surface having the cavities and is segmented around the cavities to form a plurality of cap structures. The cap structures are hermetically sealed to a device wafer to form hermetic windows over devices and pads located on the device wafer.

13 Claims, 13 Drawing Sheets

METHOD FOR WAFER LEVEL PACKAGING AND FABRICATING CAP STRUCTURES

BACKGROUND OF THE INVENTION

1. Field of the Invention

The present invention relates to a method for wafer level packaging, and more particularly, to a method for wafer level packaging having a hermetic window formed by hermetic bonding of cap structures to a device wafer.

2. Description of the Prior Art

Figure 1:
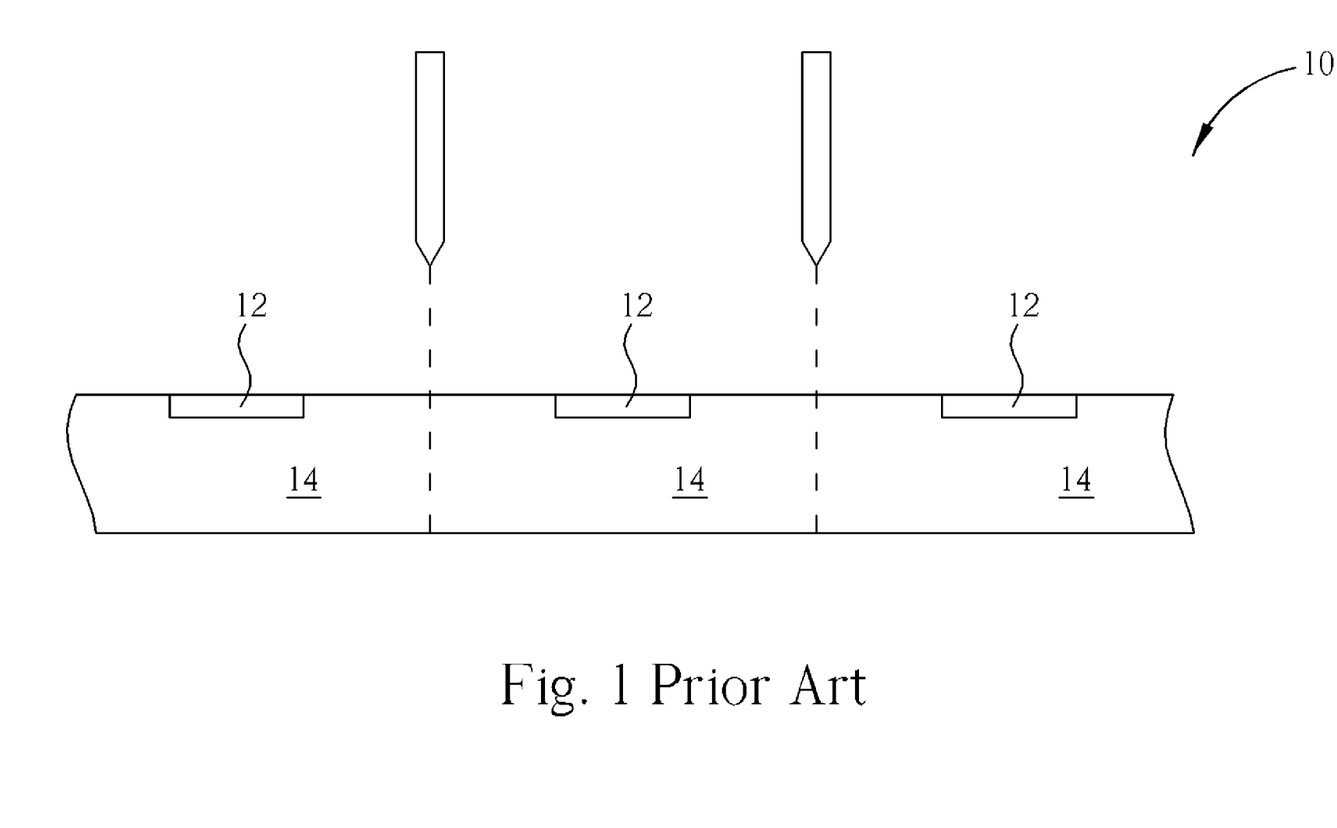
FIGS. 1-4 are schematic diagrams illustrating a conventional method for packaging.

Generally, a wafer level package (WLP) is a semiconductor package in which the size of a finished package is similar to or slightly larger than a semiconductor die. After completion of all test processes and assembly processes or packaging processes, individual semiconductor packages are separated from a wafer having a plurality of semiconductor dies. Therefore WLP not only decreases a size of a memory module, but also satisfies a demand for high density. Further, WLP improves transmission speed and stability by effectively reducing noise. Please refer to FIGS. 1-4, which are schematic diagrams illustrating a conventional method of wafer level packaging. As shown in FIG. 1, a device wafer 10 including a plurality of devices 12 positioned on its surface is provided. A dicing process is performed according to pre-defined scribe lines (not shown) so as to separate the device wafer 10 into a plurality of dies 14.

Figure 2:
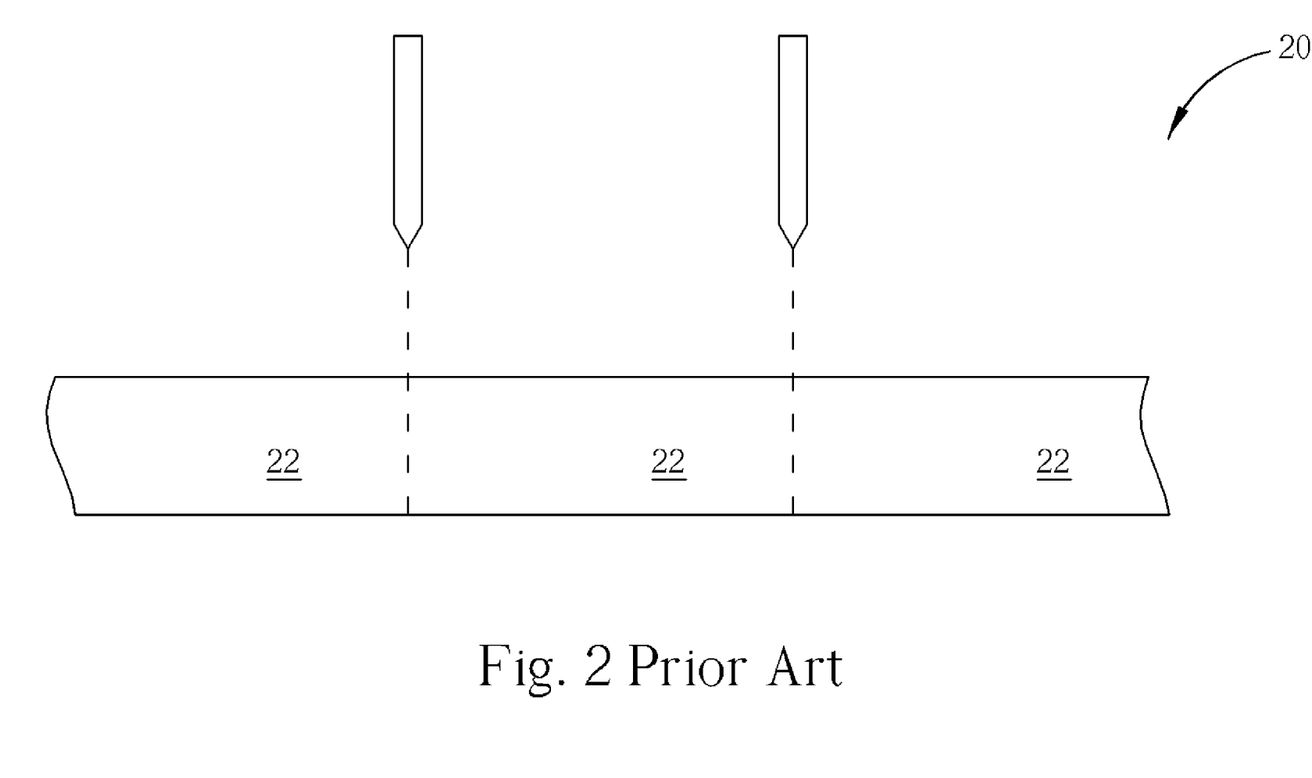
Figure 3:
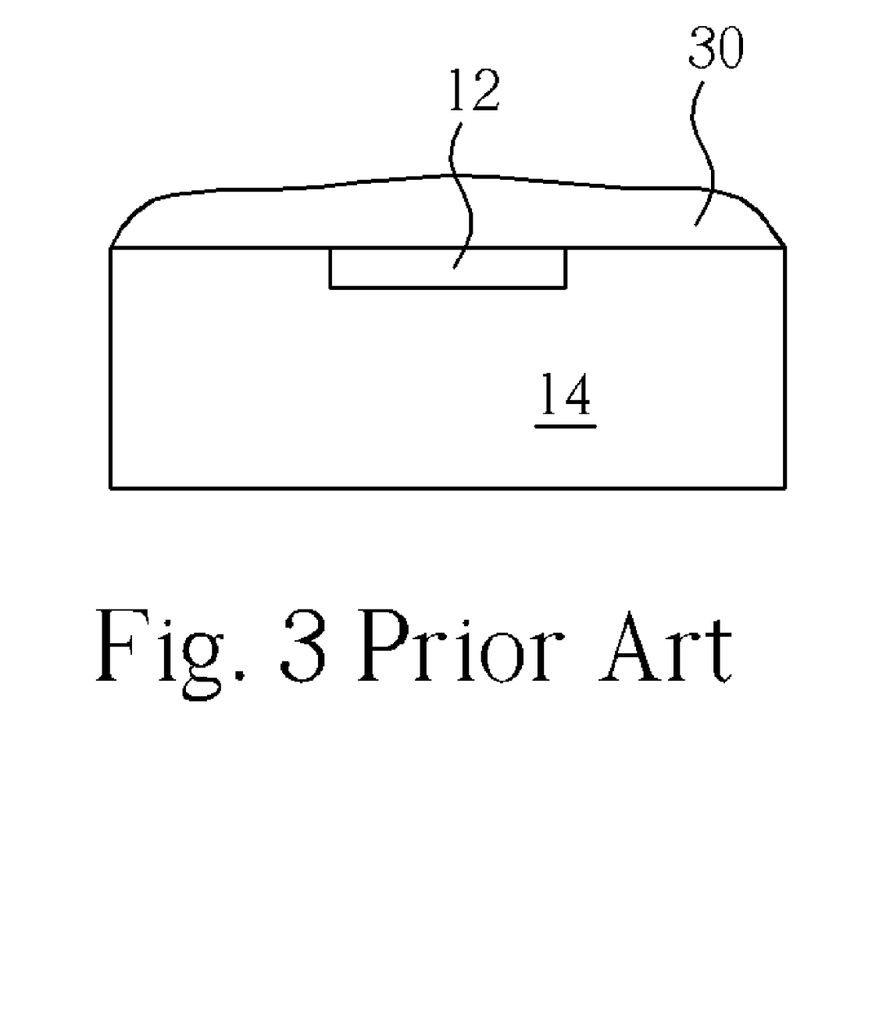
Figure 4:
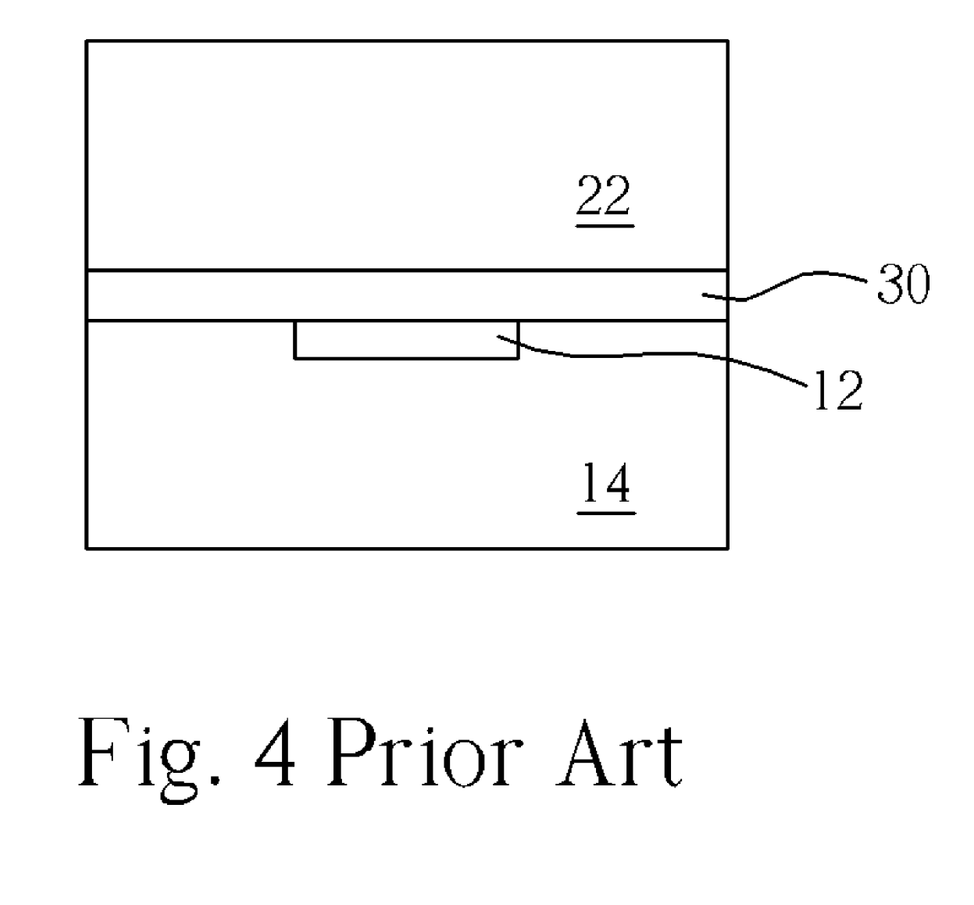

Please refer to FIG. 2. A cap wafer 20 is provided and undergoes a segmenting process to form a plurality of caps 22. The shape of each cap 22 corresponds to each die 14 while the size of each cap 22 is similar to or slightly smaller than the size of the die 14. Please refer to FIG. 3. A sealing agent 30, such as a polymer glue, is applied to a surface of the die 14. As shown in FIG. 4, the cap 22 is bonded to the die 14 by the sealing agent 30.

When the device wafer carries image sensory devices or microelectromechanical systems (MEMS) devices, which need space for light-sensing areas or allowing the MEMS devices to move, hermetic windows are required to protect the devices from contamination by air, dust, moisture, etc. The hermetic windows also protect the devices from mechanical or radioactive influences, prevent gas, which fills the hermetic window of the image sensory device die, from leaking, and prevent destruction of the vacuum condition of the hermetic window of the MEMS device die. The reliability and lifetime of the die depend on the hermetic window made by the hermetically sealed cavity or protective cap. In addition, the sealing agent used in the conventional method is easily affected by heat and thus affects the reliability of the package, making the sealing agent unsuitable for hermetic packaging.

In addition to the considerations mentioned above surrounding hermetic sealing, the dies are individually and manually bonded to the protective caps and packaged after dicing of the device wafer. Therefore the conventional method reduces the efficiency of back-end-of-line processes and the yield of semiconductor packaging processes or MEMS processes, and suffers the disadvantages of high cost and labor.

SUMMARY OF THE INVENTION

It is therefore a primary objective of the present invention to provide a method for wafer level packaging having a hermetic window.

According to the claimed invention, a method for wafer level packaging and fabricating cap structures is provided. The method comprises steps of providing a cap wafer, forming a plurality of cavities on a surface of the cap wafer, forming a patterned photoresist on the cap wafer and removing the patterned photoresist after etching the cap wafer through the patterned photoresist to form a plurality of openings, bonding the cap wafer to a transparent wafer at the surface having the cavities, wherein the cavities are not bonded to the transparent wafer, segmenting the cap wafer around the cavities and removing cavity parts of the cap wafer to form a plurality of cap structures. The method also comprises steps of providing a device wafer with a plurality of devices and a plurality of contact pads electrically connected to the devices, and hermetically bonding the cap structures to the device wafer at positions corresponding to the devices to form a plurality of hermetic windows.

According to the method provided by the present invention, the wafer level package having a hermetic window has an advantage of enabling batch production over manual bonding of individual cap structures to individual dies.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
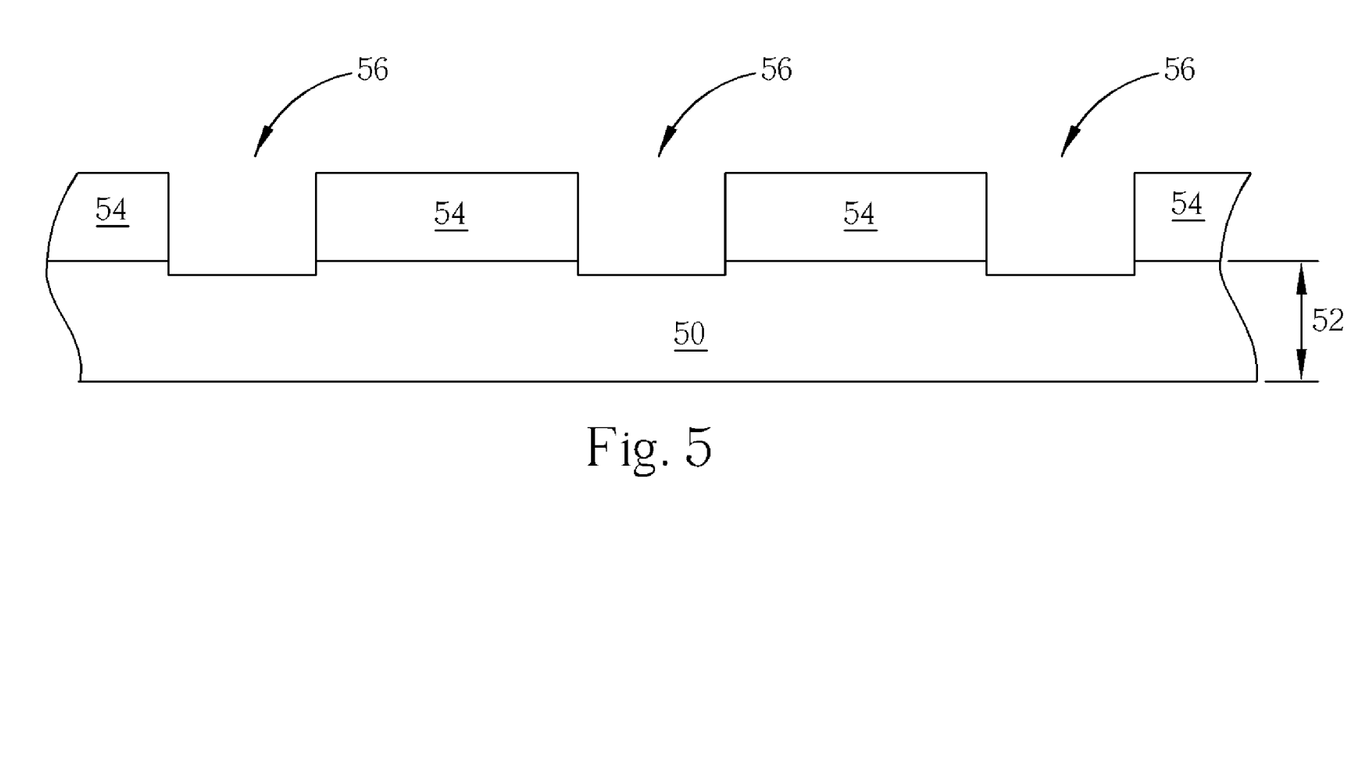
FIGS. 5-13 are schematic diagrams illustrating a method for wafer level packaging and fabricating cap structures provided by the present invention.

Please refer to FIGS. 5-13 which are schematic diagrams illustrating the method for wafer level packaging and fabricating cap structures provided by the present invention. As shown in FIG. 5, a cap wafer 50, such as a semiconductor wafer, having a thickness 52 is first provided. Then, a patterned photoresist 54 is formed on a surface of the cap wafer 50. The patterned photoresist 54 is used as an etching mask when the cap wafer is etched to form a plurality of cavities 56. The etching method can be a dry etching method, such as deep reactive ion etching (Deep RIE), or a wet etching method with an etchant such as Tetra Methyl Ammonium Hydroxide (TMAH). The cavities 56 are used to define sizes and shapes of a plurality of hermetic windows formed in following steps. In this preferred embodiment, depths of the cavities 56 are approximately 5-10 μm.

Figure 6:
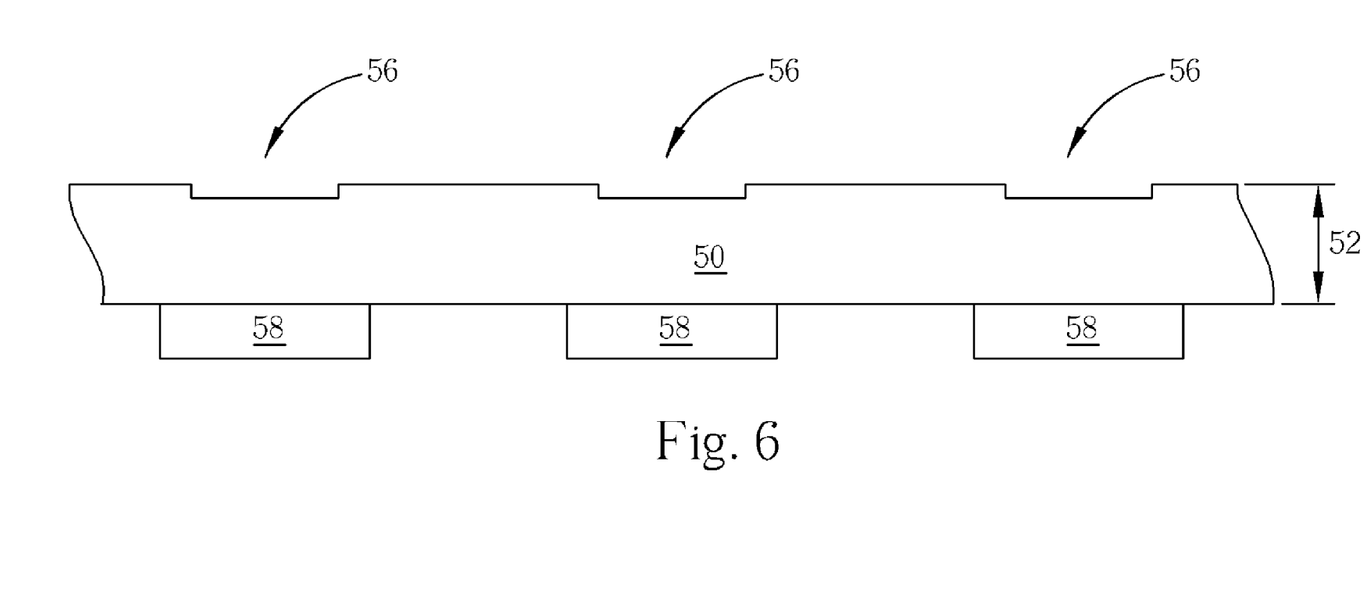
Figure 7:
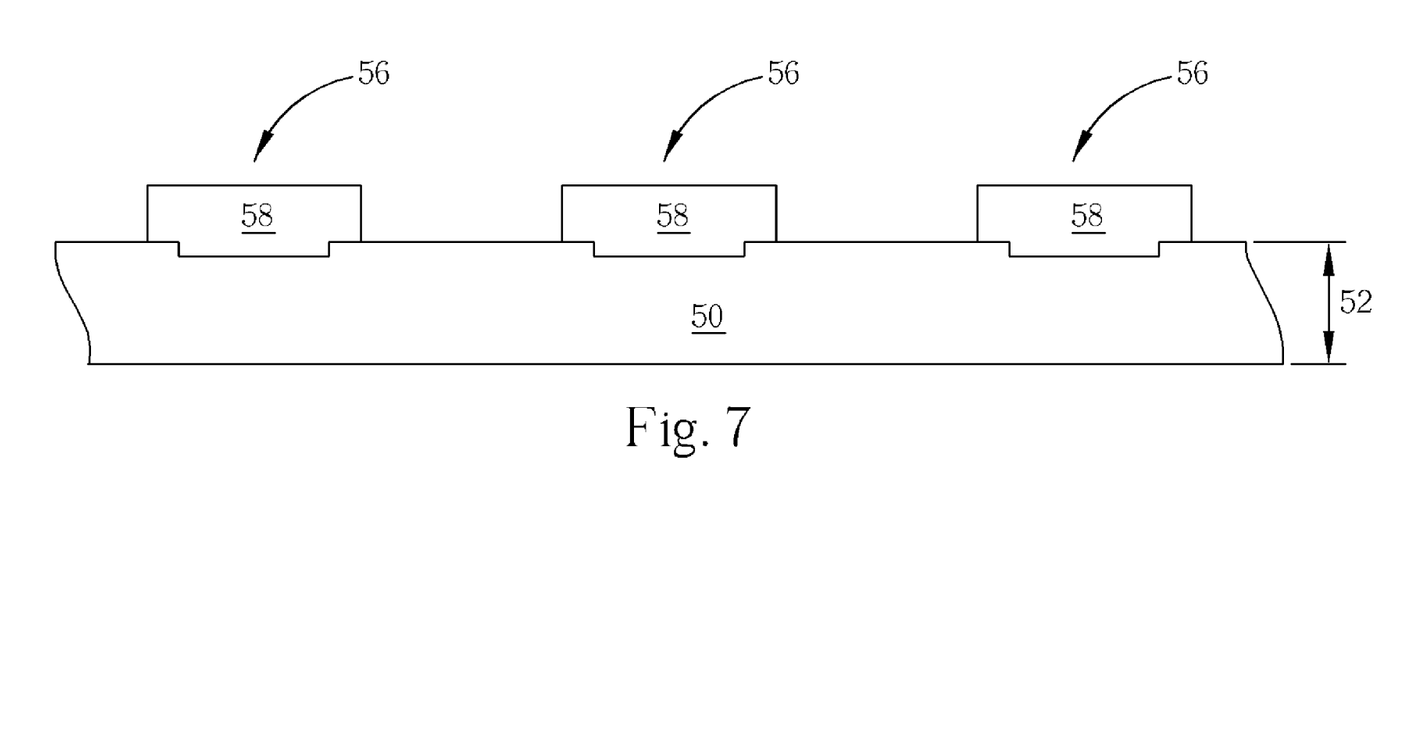
Figure 8:
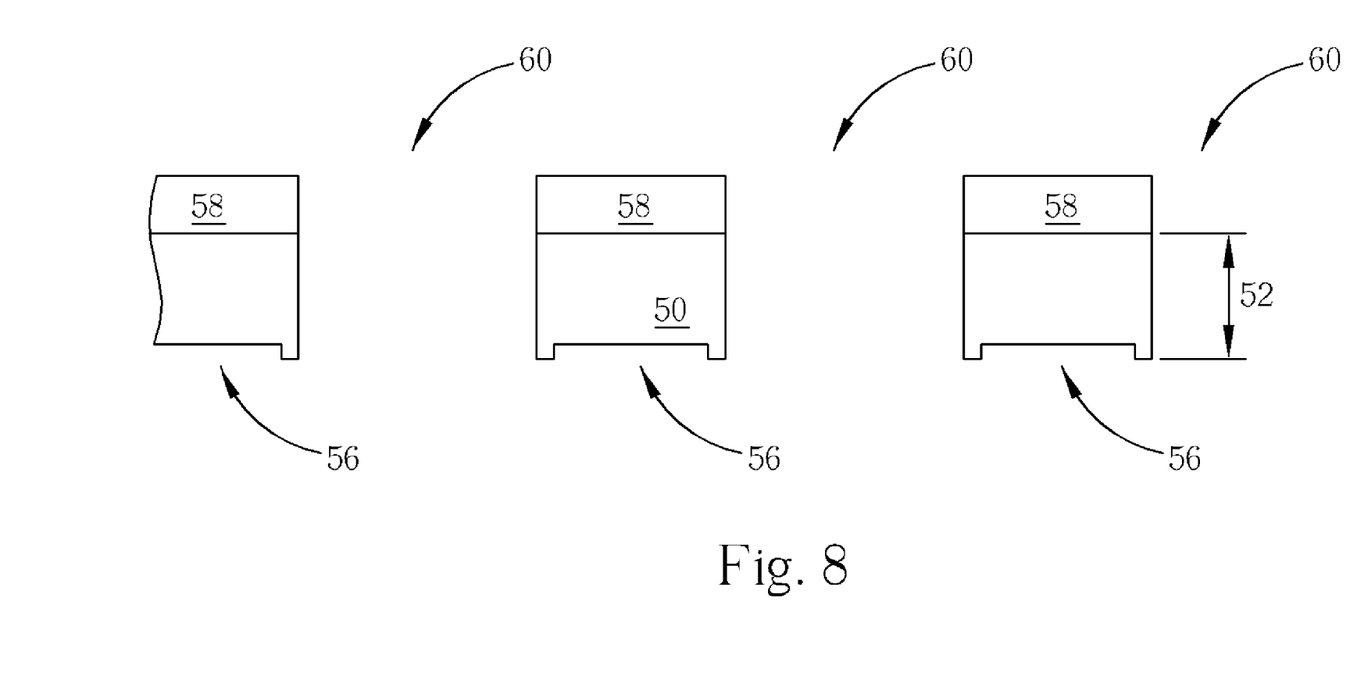

Please refer to FIG. 6. After removing the patterned photoresist 54, a patterned photoresist 58 is formed on a surface opposite to the cavities 56. It is noteworthy that the patterned photoresist 58 is formed corresponding to the cavities 56 and areas covered by the patterned photoresist 58 are larger than the cavities 56. In addition, the patterned photoresist 58 and the cavities 56 can be formed on the same surface of the cap wafer 50 as shown in FIG. 7. Next, as shown in FIG. 8, an etching process is performed, with the patterned photoresist 58 being a mask, to form a plurality of openings 60 penetrating the cap wafer 50. After the etching process, the patterned photoresist 58 is removed.

Figure 9:
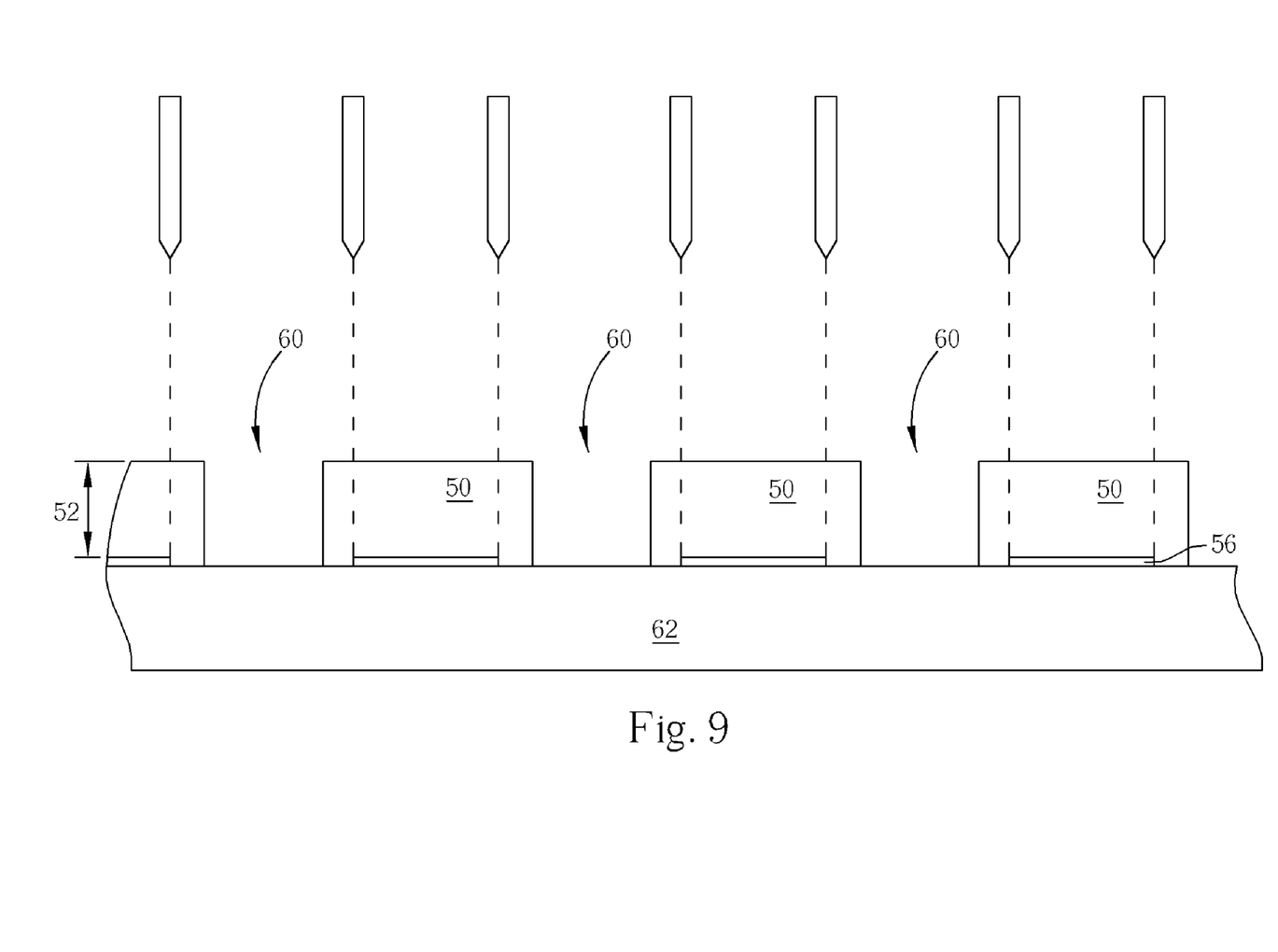
Figure 10:
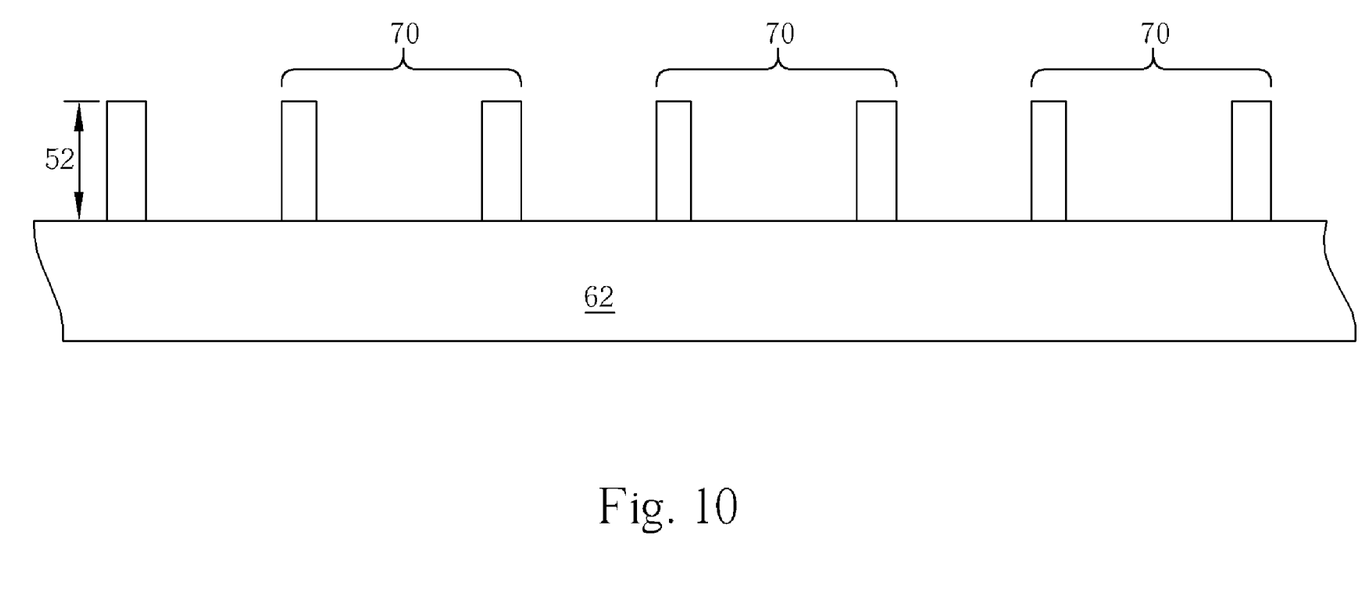

Please refer to FIGS. 9 and 10. A transparent wafer 62, such as a glass wafer or a quartz wafer, is provided. The cap wafer 50 is bonded to the transparent wafer 62 at the surface having the cavities 56 by an anodic bonding process which applies a high voltage to the cap wafer 50 and the transparent wafer 62, which are connected to a positive electrode and a negative electrode, respectively, and bonds the cap wafer 50 and the transparent wafer 62 at a temperature ranging from 400-500° C. The cap wafer 50 can also be bonded to the transparent wafer 62 by a fusion bonding process, which bonds the cap wafer 50 and the transparent wafer 62 at a temperature ranging from 650-800° C. It is noteworthy that due to the high temperature requirements for the anodic bonding process and the fusion bonding process, the bonding of the cap wafer 50 and the transparent wafer 62 requires no adhesive medium, and the cap structure formed in a later step has an advantage of better air tightness.

Because bottoms of the cavities 56 are lower than the surface of the cap wafer 50, cavities 56 cannot be bonded to the transparent wafer 62 in the bonding process. Then, a first segmenting process is performed to segment the cap wafer 50 around the cavities 56. During the first segmenting process, the depth of the segmenting equals the thickness 52 of the cap wafer 50. In addition, as mentioned above, because the cavities 56 cannot be bonded to the transparent wafer 62, parts of the cavities 56 can be removed to form a plurality of cap structures 70 after the first segmenting process. It is noteworthy that before the first segmenting process, a thinning process can be performed to adjust the thickness 52 of the cap wafer 50 to obtain a proper range between the cap structures 70 and a device wafer.

Figure 11:
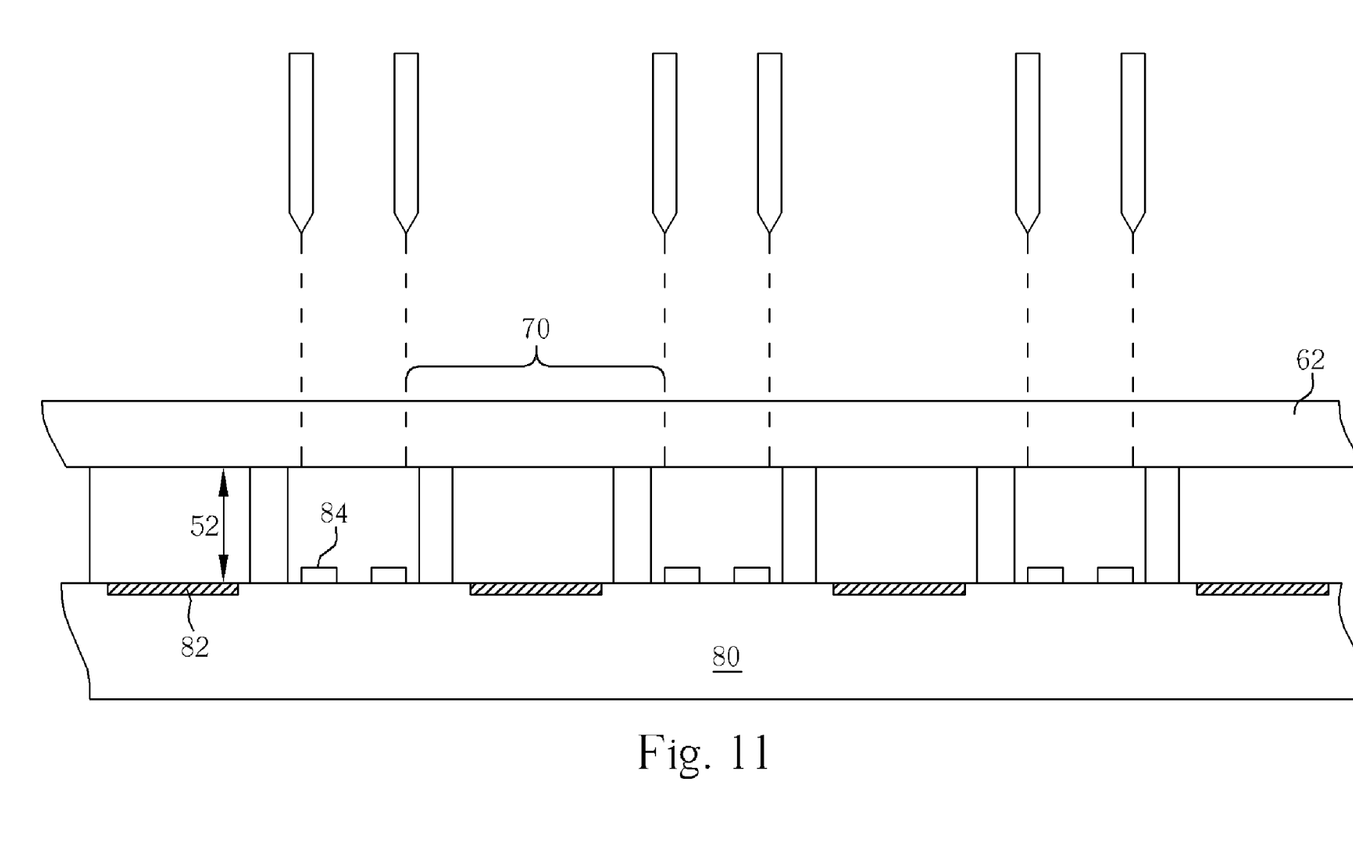

Please refer to FIG. 11. Hereinafter, a device wafer 80 is provided. The device wafer 80 comprises a plurality of devices 82 such as semiconductor devices, optical devices, or electromechanical devices. The device wafer 80 also comprises a plurality of contact pads 84 electrically connected to each device 82. Then, an alignment process is performed to locate the cap structures 70 at a position corresponding to the devices 82. A eutectic bonding process, or a glass frit bonding process, is performed to hermetically bond the cap structures 70 to the device wafer 80.

Figure 12:
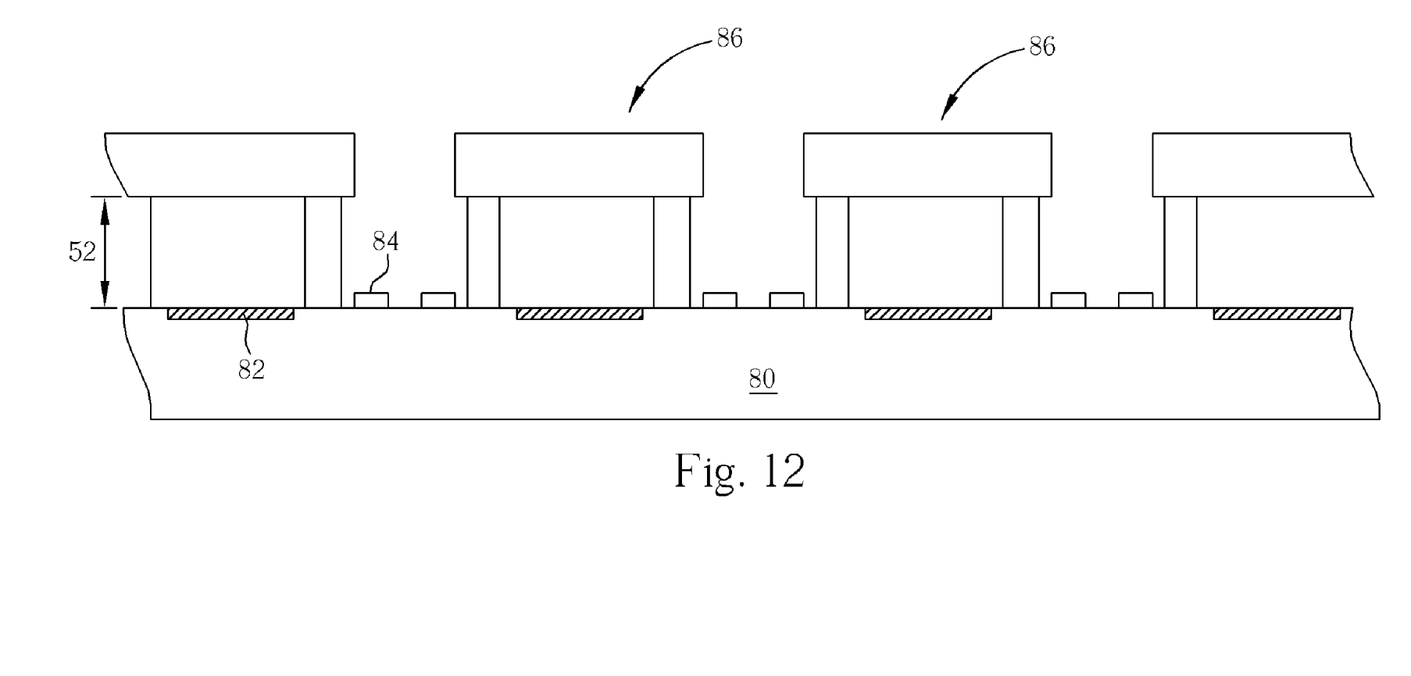
Figure 13:
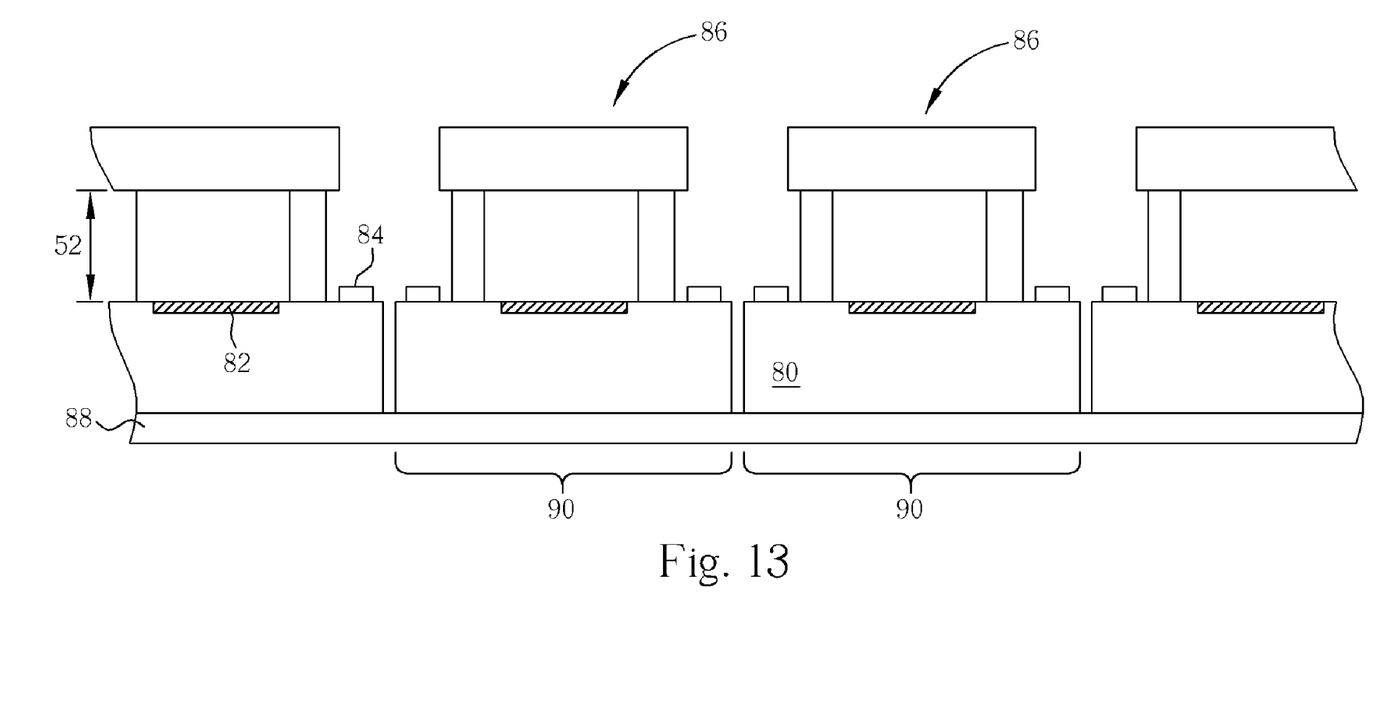

Please refer to FIGS. 12-13. As shown in FIG. 12, a second segmenting process is performed to segment the cap structure 70 at positions corresponding to the contact pads 84. The contact pads 84 are therefore exposed, and a plurality of hermetic windows 86 are formed. In addition, after forming the hermetic windows 86, a test process is performed on the devices 82 and the contact pads 84 on the device wafer 80. As mentioned above, the wafer level package has the advantage of wafer-level testing, which greatly improves an efficiency of the testing process.

As shown in FIG. 13, the device wafer 80 is next attached to a sawing tape 88 and fixed in a frame (not shown). An alignment process and a dicing process are sequentially performed to separate the device wafer 80 along predefined scribe lines into individual dies 90. Then, a wafer sorting process is allowed after the dicing process.

According to the method provided by the present invention, a cap wafer having a hermetic window pattern is bonded to a transparent wafer to form a plurality of cap structures, and then the cap structures are bonded to a device wafer to form a plurality of hermetic windows for protecting devices on the device wafer. Contrasting with the prior art, the present invention introduces batch production to obtain higher yields and reduce cost. Furthermore, because the cap wafer and the transparent wafer are bonded without a sealing medium, the wafer level packages provided by the present invention have a benefit of better air tightness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for wafer level packaging comprising steps of:
    providing a cap wafer;
    forming a plurality of cavities on a surface of the cap wafer;
    forming a patterned photoresist on the cap wafer and etching the cap wafer through the patterned photoresist to form a plurality of openings, then removing the patterned photoresist;
    bonding the cap wafer to a transparent wafer at the surface having the cavities, wherein the cavities are not bonded to the transparent wafer;
    segmenting the cap wafer around the cavities and removing a portion of the cap wafer not bonded to the transparent wafer to form a plurality of cap structures;
    providing a device wafer with a plurality of devices and a plurality of contact pads electrically connected to the devices; and
    hermetically bonding the cap structures to the device wafer at positions corresponding to the devices to form a plurality of hermetic windows.

2. The method of claim 1, wherein the devices are optical devices, microelectromechanical systems (MEMS), or semiconductor devices.

3. The method of claim 1, further comprising a thinning process applied to the cap wafer before segmenting the cap wafer for adjusting a range between the cap structure and the device wafer.

4. The method of claim 1, wherein the cavities are used to define shapes and sizes of the hermetic windows.

5. The method of claim 1, wherein the patterned photoresist is formed corresponding to the cavities.

6. The method of claim 5, wherein the patterned photoresist and the cavities are formed at the same surface of the cap wafer.

7. The method of claim 5, wherein the patterned photoresist is formed at the opposite surface to the cavities.

8. The method of claim 5, wherein areas covered by the patterned photoresist are larger than the cavities.

9. The method of claim 1, wherein the cap wafer is a semiconductor wafer.

10. The method of claim 1, wherein the transparent wafer is a glass wafer or a quartz wafer.

11. The method of claim 1, wherein the cap wafer and the transparent wafer are bonded by an anodic bonding process or a fusion bonding process.

12. The method of claim 1, wherein the cap structure and the device wafer are bonded by a eutectic bonding process or a glass frit bonding process.

13. The method of claim 1 further comprising steps performed after hermetically bonding the cap structures to the device wafer, the steps comprising:
    segmenting the cap structure at positions corresponding to the contact pads to expose the contact pad; and
    dicing the device wafer to obtain a plurality of packages.

* * * * *